(12) United States Patent
Wang et al.

(10) Patent No.: US 6,420,074 B2
(45) Date of Patent: Jul. 16, 2002

(54) PHASE SHIFTING CIRCUIT MANUFACTURE METHOD AND APPARATUS

(75) Inventors: Yao-Ting Wang, Sunnyvale; Yagyensh Pati, Redwood City, both of CA (US)

(73) Assignee: Numerial Technologies, Inc., San Jose, CA (US)

( * ) Notice: Subject to any disclaimer, the term of this patent is extended or adjusted under 35 U.S.C. 154(b) by 0 days.

(21) Appl. No.: 09/732,407

(22) Filed: Dec. 7, 2000

Related U.S. Application Data

(63) Continuation of application No. 09/617,613, filed on Jul. 17, 2000, now Pat. No. 6,258,493, which is a continuation of application No. 09/229,455, filed on Jan. 12, 1999, now Pat. No. 6,228,539, which is a continuation of application No. 08/931,921, filed on Sep. 17, 1997, now Pat. No. 5,858,580.
(60) Provisional application No. 60/025,972, filed on Sep. 18, 1996.

(51) Int. Cl.⁷ .................................................. G03F 9/00
(52) U.S. Cl. .............................................................. 430/5
(58) Field of Search ............................ 430/5, 322, 311, 430/394

(56) References Cited

U.S. PATENT DOCUMENTS

| | | | |
|---|---|---|---|
| 4,456,371 A | 6/1984 | Lin | 355/71 |
| 5,242,770 A | 9/1993 | Chen et al. | 430/5 |
| 5,302,477 A | 4/1994 | Dao et al. | 430/5 |

(List continued on next page.)

FOREIGN PATENT DOCUMENTS

| | | |
|---|---|---|
| EP | 0 698 821 | 2/1996 |
| JP | 2650962 | 11/1989 |
| JP | 7-111528 | 2/1991 |
| JP | 8-51068 | 2/1996 |
| JP | 8-236317 | 9/1996 |
| JP | 2638561 | 4/1997 |
| JP | 10-133356 | 5/1998 |
| JP | 11-143085 | 5/1999 |

OTHER PUBLICATIONS

Ibsen, K. et al., "Clear Field Reticle Defect Disposition for Advanced Sub–Half Micron Lithography", Proceedings of the 17th Annual Symposium on Photomask Technology and Management, *SPIE*, vol. 3236, pp. 124–135 (1997).

Roman, B. et al., "Implications of Device Processing on Photomask CD Requirements", Proceedings of the 17th Annual Symposium on Photomask Technology and Management, *SPIE*, vol. 3236, (1997) (Abstract).

Gans, F. et al., "Printability and Repair Techniques for DUV Photomasks", Proceedings of the 17th Annual Symposium on Photomask and Technology Management, *SPIE*, vol. 3236, pp. 136–141 (1997).

Morimoto, H. et al., "Next Generation Mask Strategy—Are technologies ready for mass production of 256 MDRAM?", Proceedings of the 17th Annual Symposium on Photomask Technology and Management, *SPIE*, vol. 3236, pp. 188–189 (1997).

(List continued on next page.)

*Primary Examiner*—Stephen D Rosasco
(74) *Attorney, Agent, or Firm*—Mark A. Haynes; Haynes Beffel & Wolfeld LLP

(57) ABSTRACT

A method and apparatus for creating a phase shifting mask and a structure mask for shrinking integrated circuit designs. One embodiment of the invention includes using a two mask process. The first mask is a phase shift mask and the second mask is a single phase structure mask. The phase shift mask primarily defines regions requiring phase shifting. The single phase structure mask primarily defines regions not requiring phase shifting. The single phase structure mask also prevents the erasure of the phase shifting regions and prevents the creation of undesirable artifact regions that would otherwise be created by the phase shift mask. Both masks are derived from a set of masks used in a larger minimum dimension process technology.

11 Claims, 5 Drawing Sheets

U.S. PATENT DOCUMENTS

| | | | |
|---|---|---|---|
| 5,308,741 A | 5/1994 | Kemp | 430/312 |
| 5,316,878 A | 5/1994 | Saito et al. | 430/5 |
| 5,326,659 A | 7/1994 | Liu et al. | 430/5 |
| 5,328,807 A | 7/1994 | Tanaka et al. | 430/311 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,532,090 A | 7/1996 | Borodovsky | 430/5 |
| 5,538,815 A | 7/1996 | Oi et al. | 430/5 |
| 5,553,273 A | 9/1996 | Liebmann | 395/500 |
| 5,565,286 A | 10/1996 | Lin | 430/5 |
| 5,572,598 A | 11/1996 | Wihl et al. | 382/144 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,631,110 A | 5/1997 | Shioiri et al. | 430/5 |
| 5,635,316 A | 6/1997 | Dao | 430/5 |
| 5,663,017 A | 9/1997 | Schinella et al. | 430/5 |
| 5,663,893 A | 9/1997 | Wampler et al. | 364/491 |
| 5,702,848 A | 12/1997 | Spence | 430/5 |
| 5,705,301 A | 1/1998 | Garza et al. | 430/5 |
| 5,707,765 A | 1/1998 | Chen | 430/5 |
| 5,725,969 A | 3/1998 | Lee | 430/5 |
| 5,740,068 A | 4/1998 | Liebmann et al. | 364/489 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,795,688 A | 8/1998 | Burdorf et al. | 430/30 |
| 5,801,954 A | 9/1998 | Le et al. | 364/488 |
| 5,804,340 A | 9/1998 | Garza et al. | 430/5 |
| 5,807,649 A | 9/1998 | Liebmann et al. | 430/5 |
| 5,815,685 A | 9/1998 | Kamon | 395/500 |
| 5,827,623 A | 10/1998 | Ishida et al. | 430/5 |
| 5,849,440 A | 12/1998 | Lucas et al. | 430/5 |
| 5,858,580 A | 1/1999 | Wang et al. | 430/5 |
| 5,885,734 A | 3/1999 | Pierrat et al. | 430/5 |
| 5,923,566 A | 7/1999 | Galan et al. | 364/489 |
| 5,994,002 A | 11/1999 | Matsuoka | 430/5 |
| 6,004,702 A | 12/1999 | Lin | 430/5 |
| 6,010,807 A | 1/2000 | Lin | 430/5 |
| 6,083,275 A | 7/2000 | Heng et al. | 716/19 |

OTHER PUBLICATIONS

Vacca, A. et al., "100nm defect detection using a dynamically programmable image processing algorithm", Proceedings of the 17th Annual Symposium on Photomask Technology and Management, *SPIE*, vol. 3236, pp. 208–215 (1997).

Ishiwata, N. et al., "Novel alternating phase shift mask with improved phase accuracy", Proceedings of the 17th Annual Symposium on Photomask Technology and Management, *SPIE*, vol. 3236, pp. 243–249 (1997).

Park, C. et al., "An Automatic Gate CD Control for A Full Chip Scale SRAM Device", Proceedings of the 17th Annual Symposium on Photomask Technology and Management, *SPIE*, vol. 3236, pp. 350–357 (1997).

Casey, Jr., D. et al., "Chemically Enhanced FIB Repair of Opaque Defects on Molybdenum Silicide Photomasks", Proceedings of the 17th Annual Symposium on Photomask Technology and Management, *SPIE*, vol. 3236, pp. 487–497 (1997).

H. Jinbo et al., "0.2 um Or Less i–Line Lithography By Phase–Shifting Mask Technology", *IEEE 1990*, pp. 33.3.1–33.3.4.

H. Jinbo, et al. "Application of Blind Method to Phase–Shifting Lithography", *IEEE 1992*, 1992 Symposium on VLSI Technology Digest of Technical Papers, pp. 112–113.

T. Kimura et al., "Subhalf–Micron Gate Gaas Mesfet Process Using Phase–Shifting–Mask Technology", *IEEE 1991*, GaAs 1C Symposium, pp. 281–284.

H. Jinbo et al., "Improvement of Phase–Shifter Edge Line Mask Method", *Japanese Journal of Applied Physics* vol. 30, No. 11B, Nov. 1991, pp. 2998–3003.

T. Brunner, "Rim Phase–Shift Mask Combined with Off–Axis Illumination: A Path to 0.5/Numerical Aperture Geometries", *Optical Engineering*, Oct. 1993, vol. 32, No. 10, pp. 2337–2343.

Nistler, J. et al., "Phase Shift Mask Defect Printability Analysis", proceedings of the '93 Conference on Microlithography, OCG Microelectronic Materials, Inc., (1993) pp. 11–28.

Ohtsuka, H. et al., "Phase Defect Repair Method for Alternating Phase Shift Masks Conjugate Twin–Shifter Method", *Jpn J. Appl. Phys.*, vol. 31, pp. 4143–4149, Dec. 1992.

Watanabe, H. et al., "Detection and Printability of Shifter Defects in Phase–Shifting Masks II. Defocus Characteristics", *Jpn J. Appl. Phys.*, vol. 31, pp. 4155–4160, Dec. 1992.

Wiley, J. et al., "Phase Shift Mask Pattern Accuracy Requirements and Inspection Technology", *SPIE*, vol. 1464, pp. 346–355 (1991).

Pati, Y.C. et al., "Exploiting Structure in Fast Aerial Image Computation for Integrated Circuit Patterns", *IEEE Transactions on Semiconductor Manufacturing*, vol. 10, No. 1, Feb. 1997, pp. 62–74.

Pati, Y.C. et al., "Phase–shifting masks for microlithography: automated design and mask requirements", *J. Opt. Soc. Am.*, vol. 11, No. 9, Sep. 1994, pp. 2438–2452.

Chang K. et al., "Accurate Modeling of Deep submicron Interconnect Technology", *TMA Times*, vol. IX, No. 3 (1997).

Brunner, T. et al., "Approximate models for resist processing effects", *SPIE*, vol. 2726, p. 198 (1996).

Henke, W. et al., "A study of reticle defects imaged into three–dimensional developed profiles of positive photoresist using the SOLID lithography simulator", *Microelectronic Eng.*, vol. 14, pp. 283–297 (1991).

Karklin, L., "A comprehensive simulation study of the photomask defects printability", *SPIE*, vol. 2621, pp. 490–504 (1995).

Ham, Y.M. et al., "Dependence of Defects in Optical Lithography", *Jpn. J. Appl. Phys.*, vol. 31, pp. 4137–4142, Dec. 1992.

Wiley, J. et al., "The Effect of Off–Axis Illumination on the Printability of Opaque and Transparent Reticle Defects", *SPIE*, vol. 2512, pp. 432–440 (1995).

Ackmann, P. et al., "Phase Shifting And Optical Proximity Corrections To Improve CD Control On Logic Devices In Manufacturing For Sub 0.35 µm I–Line", Advance Micro Devices (8 pages).

Asai, S. et al., "High Performance Optical Lithography Using A Separated Light Source", *J. Vac. Sci. Technol. B*, vol. 10, No. 6, pp. 3023–3026, Nov./Dec. 1992.

Barouch, E. et al., "Optimask: An OPC Algorithm For Chrome and Phase–Shift Mask Design", *SPIE*, vol. 2440, pp. 192–206, Feb. 1995.

Fukuda, H. et al., "Determinants Of High–Order Lens Aberration Using Phase/Amplitude Linear Algebra", *J. Vac. Sci. Technol. B,* vol. 17, No. 6, pp. 3318–3321, Nov./Dec. 1999.

Fukuda, H., "Node–Connection/Quantum Phase–Shifting Mask: Path To Below 0.3 $\mu$m Pitch, Proximity Effect Free, Random Interconnects And Memory Patterning", *J. Vac. Sci. Technol. B.,* vol. 17, No. 6, pp. 3291–3295, Nov./Dec. 1999.

Galan, G. et al., "Applications Of Alternating–Type Phase Shift Mask To Polysilicon Level For Random Logic Circuits", *Jpn. J. Appl. Phys.,* vol. 33, pp. 6779–6784 (1994).

Matsouka, K. et al., "Applications Of Alternating Phase–Shifting Mask To 0.16 $\mu$m CMOS Logic Gate Patterns", Matsushita Electric Ind. Co., Ltd. (9 pages).

Mizuno, F. et al., "Practical Phase–Shifting Mask Technology For 0.3 $\mu$m Large Scale Integrations", *J. Vac. Sci. Technol B,* vol. 12, No. 6, pp. 3799–3803, Nov./Dec. 1994.

Neureuther, A., "Modeling Phase Shifting Masks", *SPIE,* $10^{th}$ Annual Symposium on Microlithography, vol. 1496, pp. 80–85 (1990).

Nistler, J. et al., "Large Area Optical Design Rule Checker For Logic PSM Application", *SPIE,* Photomask and X–Ray Mask Technology, vol. 2254, pp. 78–92 (1994).

Pierrat, C. et al., "A Rule–Based Approach To E–Beam And Process–Induced Proximity Effect Correction For Phase–Shifting Mask Fabrication", *SPIE,* vol. 2194, pp. 298–309 (1994).

Pierrat, C. et al., "Phase Shifting Mask Topography Effects On Lithographic Image Quality", *IEEE,* pp. 3.3.1–3.3.4 (1992).

Rieger, M. et al., "System For Lithography Proximity Compensation", Precim Company, Portland, Oregon, Sep. 1993 (28 pages).

Spence, C. et al., "Automated Determination Of CAD Layout Failures Through Focus: Experiment And Simulation", *SPIE,* vol. 2197, pp. 302–313 (1994).

Spence, C. et al., "Detection Of 60° Phase Defects On Alternation PSMs", Advance Micro Devices, KLA–Tencor, DuPont RTC (2 pages).

Spence, C. et al., "Integration Of Optical Proximity Correction Strategies In Strong Phase Shifters Design For Poly–Gate Layers", *Bacus News,* vol. 15, Issue 12, pp. 1, 4–13, Dec. 1999.

Stirniman, J. et al., "Wafer Proximity Correction And Its Impact On Mask Making", *Bacus News,* vol. 10, Issue 1, pp. 1, 3–7, 10–12, Jan. 1994.

Sugawara, M. et al., "Defect Printability Study Of Attenuated Phase–Shifting Masks For Specifying Inspection Sensitivity", Semiconductor Company, Sony Corporation, Kanagawa, Japan (16 pages).

Terasawa, T. et al., "0.3–Micron Optical Lithography Using A Phase–Shifting Mask", *SPIE,* Optical/Laser Microlithography II, vol. 1088, pp. 25–33, Mar. 1989.

Wiley, J. et al., "Device Yield And Reliability By Specification Of Mask Defects", *Solid State Technology,* vol. 36, No. 7, pp. 65–66, 70, 72, 74, 77, Jul. 1993.

Galan, G. et al., "Application of Alternating–Type Phase Shift Mask to Polysilicon Level for Random Logic Circuits", *Jpn. J. Appl. Phys.,* vol. 33 (1994), Pt. 1, No. 12B, Dec. 1994, pp. 6779–6784.

Inoue, S. et al., Simulation Study of Phase–Shifting Masks for Isolated Patterns, *Jpn. J. Appl. Phys.,* vol. 30, No. 11B, Nov. 1991, pp. 3010–3015.

Kikuchi, K. et al., "Method of Expanding Process Window for the Double Exposure Technique with alt–PSMs", *SPIE,* Optical Microlithography XIII, vol. 4000 (2000), pp. 121–131.

Terasawa, T. et al., "Imaging Characteristics of Multi–Phase–Shifting and Halftone Phase–Shifting Masks", *Jpn. J. Appl. Phys.,* vol. 30, No. 11B, Nov. 1991, pp. 2991–2997.

Watanabe, H. et al., "Detection and Printability of Shifter Defects in Phase–Shifting Masks", *Jpn. J. Appl. Phys.,* vol. 30, No. 11B, Nov. 1991, pp. 3016–3020.

Watanabe H. et al., "Pattern Transfer Characteristics of Transparent Phase Shifting Mask", *Jpn. J. Appl. Phys.,* vol. 30, No. 11B, Nov. 1999, pp. 3004–3009.

Levenson, M. et al., "Improving Resolution in Photolithography with a Phase–Shifting Mask", *IEEE Transactions on Electron Devices,* vol. ED–29, No. 12, Dec. 1982, pp. 1828–1836.

Lin, B.J., "Phase–Shifting Masks Gain an Edge", *IEEE Circuits & Devices,* New York, Mar. 1993, pp. 28–35.

Inokuchi, K. et al., "Sub–Quarter Micron Gate Fabrication Process Using Phase–Shifting–Mask for Microwave GaAs Devices", Extended Abstracts of the 1991 Intl. Conference on Solid State Devices and Materials, Yokohama, Japan (Aug. 1991), pp. 92–94.

Inokuchi, K. et al., "Sub–Quarter Micron Gate Fabrication Process Using Phase–Shifting–Mask for Microwave GaAs Devices", *Japanese Journal of Applied Physics,* vol. 30, No. 12B, Dec. 1991, pp. 3818–3821.

Jinbo, H. et al., "Improvement of Phase–Shifter Edge Line Mask Method", Japanese Journal of Applied Physics, vol. 30, No. 11B, (Nov. 1991), pp. 2998–3003.

Brunner, T. et al., "170 nm gates fabricated by phase–shift mask and top anti–reflector process", *SPIE,* vol. 1927, Optical/Laser Microlithography VI (1993), pp. 182–189.

Liu, H. et al., "Fabrication of 0.1 $\mu$m T–shaped gates by phase–shifting optical lithography", *SPIE,* vol. 1927, Optical/Laser Microlithography VI (1993), pp. 42–52.

PHASE SHIFTING CIRCUIT MANUFACTURE METHOD AND APPARATUS

This application is a continuation of application Ser. No. 09/617,613, filed Jul. 17, 2000 now U.S. Pat. No. 6,258,493; which is a continuation of application Ser. No. 09/229,455, filed Jan. 12, 1999 now U.S. Pat. No. 6,228,539; which is a continuation of application Ser. No. 08/931,921, filed Sep. 17, 1997 now U.S. Pat. No. 5,858,580; which application claims the benefit of the filing date of U.S. Provisional Application No. 60/025,972, filed Sep. 18, 1996.

RELATED APPLICATIONS

This application relates to, claims benefit of the filing date of, and incorporates by reference, the U.S. provisional patent application entitled, "Transistor Manufacturing Using Phase Shifting," having serial No. 60/025,972, and filed Sep. 18, 1996, and which is assigned to the assignee of the present invention.

THE BACKGROUND OF THE INVENTION a. The Field of the Invention

This invention relates to the field of integrated circuit manufacturing. In particular, the invention relates to phase shifting techniques in the optical lithography patterning process.

b. Background Information

Lithography processing is a required and essential technology when manufacturing conventional integrated circuits. Many lithography techniques exist, and all lithography techniques are used for the purpose of defining geometries, features, lines, or shapes onto an integrated circuit die or wafer. In general, a radiation sensitive material, such as photoresist, is coated over a top surface of a die or wafer to selectively allow for the formation of the desired geometries, features, lines, or shapes.

One known method of lithography is optical lithography. The optical lithography process generally begins with the formation of a photoresist layer on the top surface of a semiconductor wafer. A mask having fully light non-transmissive opaque regions, which are usually formed of chrome, and fully light transmissive clear regions, which are usually formed of quartz, is then positioned over the aforementioned photoresist coated wafer. Light is then shone on the mask via a visible light source or an ultra-violet light source. In almost all cases, the light is reduced and focused via an optical lens system which contains one or several lenses, filters, and or mirrors. This light passes through the clear regions of the mask and exposes the underlying photoresist layer, and is blocked by the opaque regions of the mask, leaving that underlying portion of the photoresist layer unexposed. The exposed photoresist layer is then developed, typically through chemical removal of the exposed/non-exposed regions of the photoresist layer. The end result is a semiconductor wafer coated with a photoresist layer exhibiting a desired pattern. This pattern can then be used for etching underlying regions of the wafer.

In recent years, there has been great demand to increase the number of transistors on a given size wafer. Meeting this demand has meant that integrated circuit designers have had to design circuits with smaller minimum dimensions. However, prior to the work of Levenson, et. al., as reported in "Improving Resolution in Photolithography with a Phase Shifting Mask," IEEE Transactions on Electron Devices, VOL., ED-29, Nov. Dec. 12, 1982, pp. 1828–1836, it was found that the traditional optical lithography process placed real limits on the minimum realizable dimension due to diffraction effects. For, at integrated circuit design feature sizes of 0.5 microns or less, the best resolution has demanded a maximum obtainable numerical aperture (NA) of the lens systems. However, as the depth of field of the lens system is inversely proportional to the NA, and since the surface of the integrated circuit could not be optically flat, good focus could not be obtained when good resolution was obtained and vice versa. Thus, as the minimum realizable dimension is reduced in manufacturing processes for semiconductors, the limits of optical lithography technology are being reached. In particular, as the minimum dimension approaches 0.1 microns, traditional optical lithography techniques will not work effectively.

One technique, described by Levenson, et. al., to realize smaller minimum device dimensions, is called phase shifting. In phase shifting, the destructive interference caused by two adjacent clear areas in an optical lithography mask is used to create an unexposed area on the photoresist layer. This is accomplished by making use of the fact that light passing through a mask's clear regions exhibits a wave characteristic such that the phase of the amplitude of the light exiting from the mask material is a function of the distance the light travels in the mask material. This distance is equal to the thickness of the mask material. By placing two clear areas adjacent to each other on a mask, one of thickness $t_1$ and the other of thickness $t_2$, one can obtain a desired unexposed area on the photoresist layer through interference. For, by making the thickness $t_2$ such that $(n-1)(t_2)$ is exactly equal to $\frac{1}{2}\lambda$, where $\lambda$ is the wavelength of the light shone through the mask material, and n is the refractive index of the material of thickness $t_1$, the amplitude of the light exiting the material of thickness $t_2$ will be 180 degrees out of phase with the light exiting the material of thickness $t_1$. Since the photoresist material is responsive to the intensity of the light, and the opposite phases of light cancel where they overlap, a dark unexposed area will be formed on the photoresist layer at the point where the two clear regions of differing thicknesses are adjacent.

Phase shifting masks are well known and have been employed in various configurations as set out by B.J. Lin in the article, "Phase-Shifting Masks Gain an Edge," Circuits and Devices, March 1993, pp. 28–35. The configuration described above has been called alternating phase shift masking (APSM). In comparing the various phase shifting configurations, researchers have shown that the APSM method can achieve dimension resolution of 0.25 microns and below.

One problem with the APSM method is that dark lines on the photoresist layer are created at all areas corresponding to 0 degree to 180 degree transitions in the mask. These dark lines, unless part of the desired end structure, should be erased at some point in the processing of the wafer.

Another problem is that the APSM method does not lend itself well to process technology shrinking. Traditionally, designers design an integrated circuit for a predetermined minimum realizable dimension. However, because process technologies can require a considerable amount of time to fine tune, the integrated circuit is first manufactured using a process technology that does not support the designed for speed and has a larger minimum dimension. Often, a first set of masks are created to manufacture the integrated circuits at the larger dimension. As the process technology improves, the minimum realizable dimension decreases. Additional mask sets are created for each new minimum dimension process. These masks are generally created using software driven machines to automatically manufacture the masks given the design features needed. However, due to the complexity of the masks needed to erase the aforementioned unwanted dark lines created when the APSM method is used, these masks have not generally been able to be designed automatically by mask creation programs. This has required mask designers to expend large amounts of time and money manually creating mask layouts when the APSM method is used.

Spence, U.S. Pat. No. 5,573,890, reveals one method to overcome these problems. Spence discloses a system in which phase shifting is used to shrink integrated circuit design, specifically to shrink transistor gate lengths, where the masks used are computer designed. The computer designs a mask or masks which achieve(s) the required minimum dimension and which provide for the removal of the unwanted dark lines created by the APSM method. In a disclosed single mask method, Spence uses transition regions to compensate for the unwanted dark lines that would have been produced where there were 0 degree to 180 degree transitions in the mask. The problem with this single mask method is that the single mask that results is complicated and difficult to manufacture. Further, the mask that is produced is very unlike the design of the circuit from a visual standpoint, thus making it difficult for designers to visually double check their work.

Spence also discloses a two mask method which is illustrated in FIG. 1. Old mask 100 represents a typical mask that would be used to produce a structure having a transistor of old gate length 109, which is wide enough to be achieved using traditional optical lithography techniques with no phase shifting. New gate length 159 is the desired transistor gate length that is smaller than the smallest dimension realizable through the process of traditional optical lithography. Spence uses a phase shift and structure mask 110 and a trim mask 120 in order to achieve the new gate length 159 and to remove the unwanted dark lines created by the phase shift method, respectively.

The phase shift and structure mask 110 is designed such that it contains both a structure chrome area 113, which is the same shape as the desired polysilicon structure of the circuit, and a phase shifter consisting of a 180 degree phase clear area 112 adjacent to a 0 degree phase clear area 111. When light is shined on the phase shift and structure mask 110, the phase shift and structure image 130 is created on the underlying photoresist layer. The phase shift and structure image 130 contains the desired final structure dark area 133 and the desired dark area 132, but also includes unwanted artifacts 135 created by interference at the transitions between the 180 degree phase clear area 112 and the 0 degree phase clear area 111.

Thus, in order to remove these unwanted artifacts 135 and achieve the desired result image 150, Spence discloses using the trim mask 120 solely to perform this function. The trim mask 120 consists of a chrome area 123 and an erasure light area 122. When light is shown on the trim mask 120, the trim image 140 is created on the photoresist layer. This trim image 140 contains an erasure light area 142 which serves to erase the unwanted artifacts 135. The result image 150 represents the final image created on the photoresist layer as a result of the two mask method disclosed by Spence.

Spence's two mask method has several problems. By combining the production of the final structure and the phase shifting onto a single mask, this method introduces a large number of possible conflicts in the design rules of the circuit as a whole. This increase in conflicts makes it much more difficult for the computer to determine a solution to the shrinking of the circuit design that is within the design rules parameters. In addition, this increase in conflicts may in some instances produce a situation where no shrunk design is possible. Furthermore, combining the structure and phase shifting on one of the two Masks increases the overall complexity of this mask thus making it more difficult to manufacture and inspect. Finally, combining structure and phase shifting on a single mask results in the design of a mask that does not look like the structure masks used for the earlier larger versions of the designed circuit. As a result, it is more difficult for the designers of the integrated circuit to visually check their work.

Therefore, what is desired is an improved method of using phase shifting to achieve smaller minimum realizable dimensions.

A SUMMARY OF THE INVENTION

A method and apparatus for creating a phase shifting mask and a structure mask for shrinking integrated circuit designs is described.

One embodiment of the invention includes using a two mask process. The first mask is a phase shift mask and the second mask is a single phase structure mask. The phase shift mask primarily defines regions requiring phase shifting. The single phase structure mask primarily defines regions not requiring phase shifting. The single phase structure mask also prevents the erasure of the phase shifting regions and prevents the creation of undesirable artifact regions that would otherwise be created by the phase shift mask. Both masks are derived from a set of masks used in a larger minimum dimension process technology.

Although many details have been included in the description and the figures, the invention is defined by the scope of the claims. Only limitations found in those claims apply to the invention.

A BRIEF DESCRIPTION OF THE DRAWINGS

The figures illustrate the invention by way of example, and not limitation. Like references indicate similar elements.

Although many details have been included in the description and the figures, the invention is defined by the scope of the claims. Only limitations found in those claims apply to the invention.

THE DESCRIPTION a. An Overview of an Embodiment of the Invention

A method and apparatus for creating a phase shift mask and a structure mask for shrinking integrated circuit designs is described. One embodiment of the invention includes using a two mask process. The first mask is a phase shift mask and the second mask is a single phase structure mask. The phase shift mask primarily defines regions requiring phase shifting. The single phase structure mask primarily defines regions not requiring phase shifting. The single phase structure mask also prevents the erasure of the phase shift regions and prevents the creation of undesirable artifact regions that would otherwise be created by the phase shift mask. Both masks are derived from a set of masks used in a larger minimum dimension process technology.

The following describes the use of a technique, in one embodiment of the invention, to shrink a design of a polysilicon layer for use in a transistor. The design is shrunk from a first process technology that does not use phase shifting to a second process technology that does use phase shifting. A phase shift mask, for the polysilicon layer, is created solely to make the gate of the transistor; the width of the gate is the minimum distance for the second process technology. This phase shift mask does not contain any of the structural elements of the remainder of the circuit. The semiconductor substrate is exposed using the first mask. A structure mask is created to make the remainder of the layer of the integrated circuit and to protect the desired phase shift regions. The semiconductor substrate is also exposed using this second mask. The first mask and the second mask are generated directly from the information used to generate the mask set for the first process technology.

In one embodiment, the second mask is exactly the same mask as was used in the first process technology. In another embodiment, the second mask has the same pattern used for the first process technology except that the dimensions used have been shrunk. In another embodiment, the second mask used has a similar pattern to the mask used for the first process technology except that a few modifications to the pattern have been made.

b. Gate Width Shrinking

Figure 2:
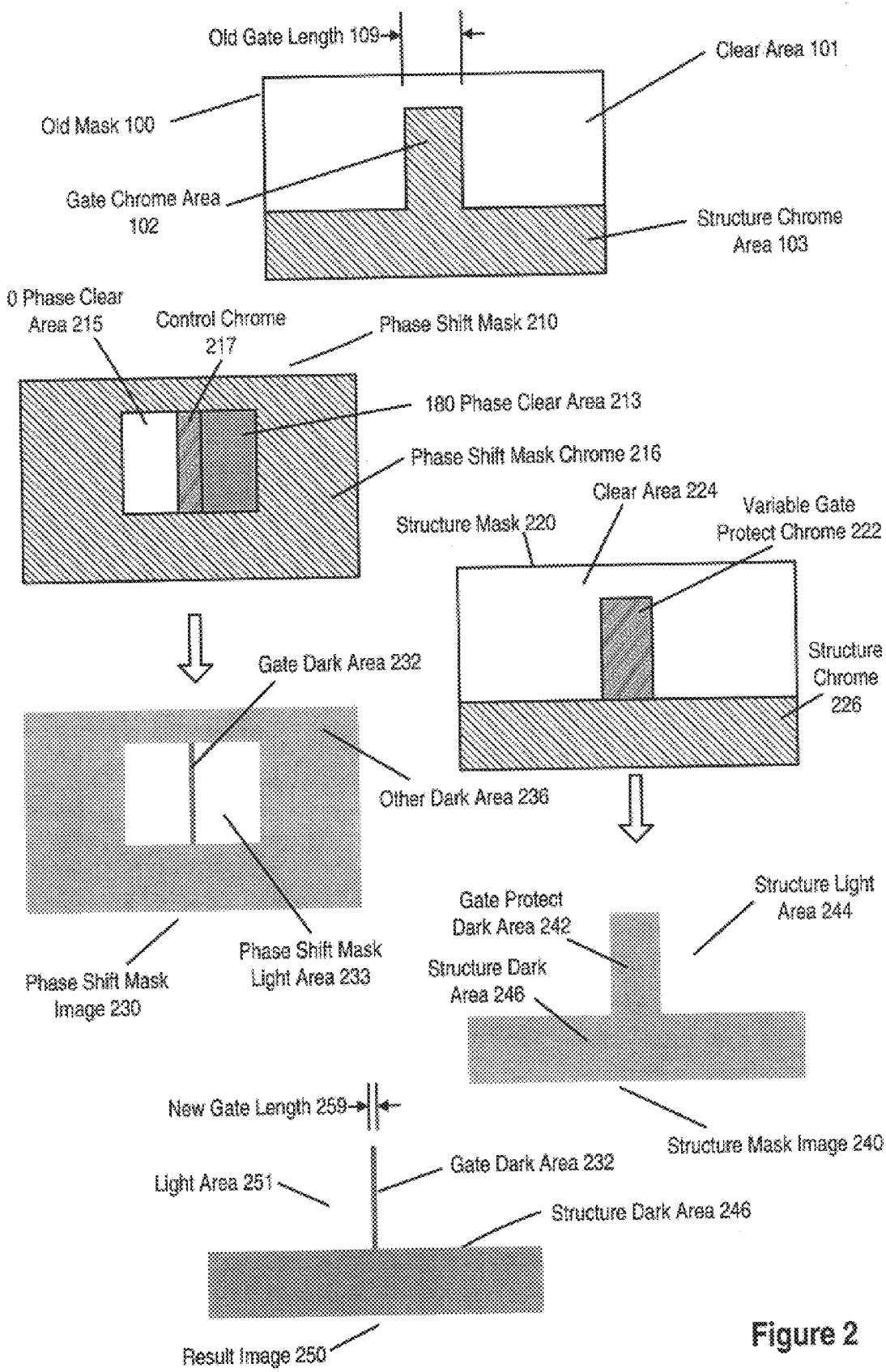
FIG. 2 illustrates one embodiment of a dual mask phase shifting process for shrinking transistor gates in an integrated circuit.

FIG. 2 illustrates one embodiment of a dual mask phase shifting process for shrinking transistor gates in an integrated circuit. The following paragraphs first describe the elements in FIG. 2, then the relationships between those elements, and then the functions of the various elements of the system.

FIG. 2 includes the following elements: An old mask 100, a phase shift mask 210, a structure mask 220, a phase shift mask image 230, a structure mask image 240, and a result image 250. The old mask 100 includes a clear area 101, a gate chrome area 102, a structure chrome area 103, and an old gate length 109. The phase shift mask 210 includes a 180 phase clear area 213, a 0 phase clear area 215, phase shift mask chrome 216, and control chrome 217. The structure mask 220 includes variable gate protect chrome 222, a clear area 224, and structure chrome 226. The phase shift mask image 230 includes a gate dark area 232, a phase shift mask light area 233, and an other dark area 236. The structure mask image 240 includes a gate protect dark area 242, a structure light area 244, and a structure dark area 246. The result image 250 includes a light area 251, a gate dark area 232, a structure dark area 246, and a new gate length 259.

Figure 1:
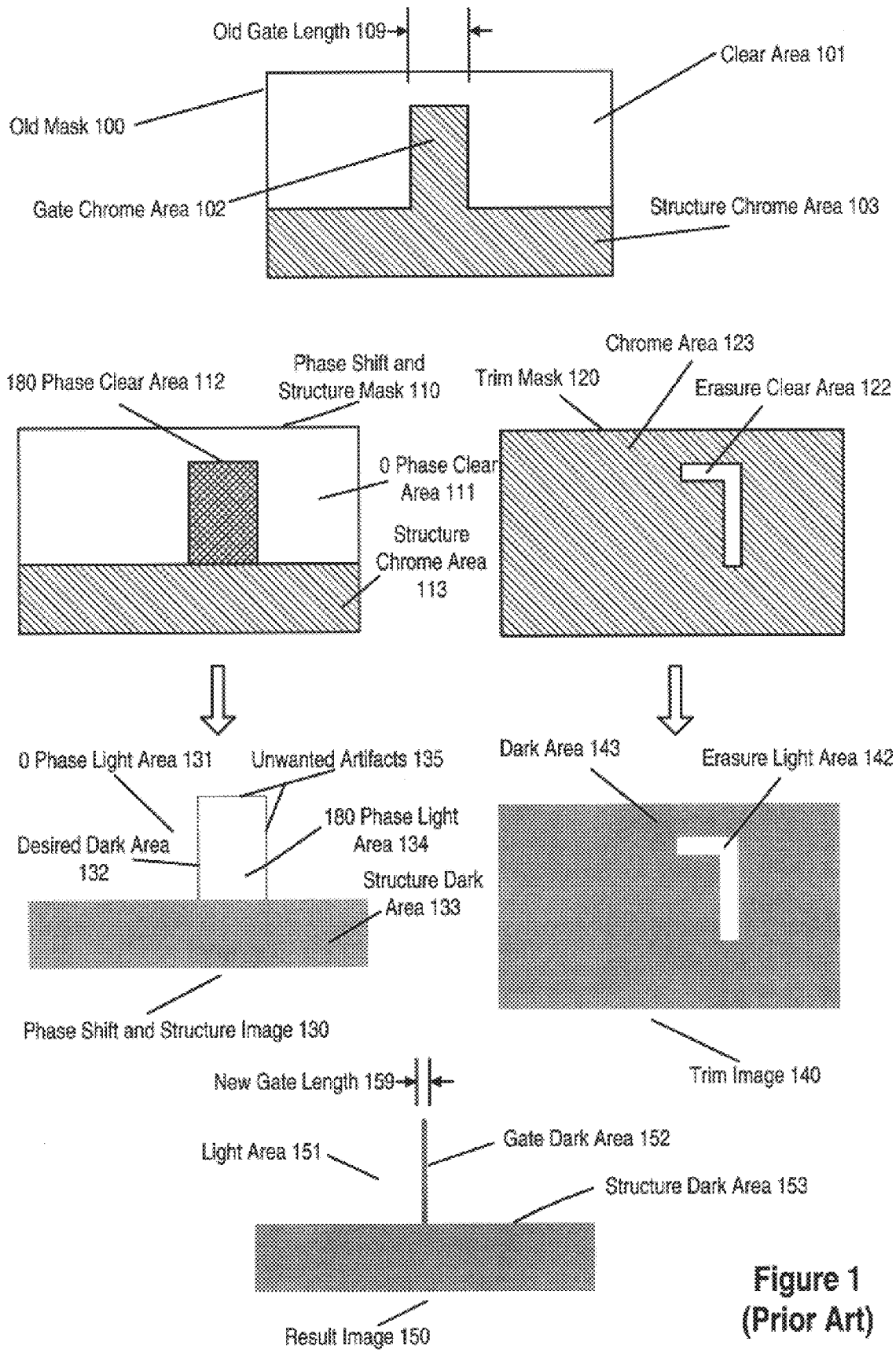
FIG. 1 illustrates a prior art dual mask phase shifting process.

The following paragraphs describe the general relationships between the elements and the main elements of FIG. 2. Old mask 100 is the same as in FIG. 1.

Phase shift mask 210 represents a top view of a mask used solely to produce a desired circuit dimension that requires the use of interference, such as a shrunk transistor gate length. The 180 degree phase clear area 213 is situated adjacent to the 0 degree phase clear area 215, and each of these clear areas is designed to allow for the full transmission of light through it. The 180 degree phase clear area 213 is of a thickness such that it will create destructive interference at its boundary with the 0 degree phase clear area 215. The control chrome 217 is opaque and does not allow for the transmission of light through it. The control chrome 217 is placed over the center of the boundary between the 180 degree phase clear area 213 and the 0 degree phase clear area 215. The width of this control chrome 217 is variable and can be completely excluded. The width of the control chrome 217 is used to control the shrunk gate length. The phase shift mask chrome 216: covers the remainder of the mask and is also opaque. The sole purpose of the phase shift mask chrome 216 is to ensure the remainder of the photoresist layer is left unexposed such that a structure may later be imprinted on the photoresist layer by the structure mask 220.

Structure mask 220 represents a top view of a mask used to imprint the desired polysilicon structure on the photoresist layer. The structure mask 220 also protects the transistor gate formed by the phase shift mask 210, and erases any unwanted artifacts created by the phase shift mask 210. The clear area 224 is designed to allow the full transmission of light through it, and is designed to cover any areas where unwanted artifacts may have been formed by the phase shift mask 210. The structure chrome 226 is opaque and is shaped and sized to define the desired polysilicon circuit structure. The variable gate protect chrome 222 is of a variable width designed to cover the entire area that the desired gate might occupy in order to protect the gate from inadvertent exposure.

Phase shift mask image 230 represents a top view of a photoresist coated silicon wafer after the wafer has had light shined on it while phase shift mask 210 was directly over the wafer. The light areas depict regions where the photoresist layer was exposed to the light.

Structure mask image 240 represents a top view of a photoresist coated silicon wafer after the wafer has had light shined on it while structure mask 220 was directly over the wafer. The light areas depict regions where the photoresist layer was exposed to the light.

Result image 250 represents the top view of a photoresist coated silicon wafer that has had light shined on it on two separate occasions. Once with phase shift mask 210 directly over the wafer, and once with structure mask 220 directly over the wafer. For the purposes of this invention, it does not matter what sequence is used. Either mask can be used first with no effect on the result image 250.

The following paragraphs describe the function of the elements of FIG. 2. When old mask 100 is placed over a photoresist coated silicon wafer and light is shined onto the mask, the light is transmitted through the clear area 101, and the photoresist material underlying the clear area 101 is exposed. Similarly, the light shined onto the mask is not transmitted through the opaque gate chrome area 102, or the opaque structure chrome area 103, and the photoresist material underlying these areas is thus not exposed. The exposed photoresist layer is now ready for development, typically by chemically removing the exposed regions of the photoresist layer. The end result would be a large dimension semiconductor wafer coated with a photoresist layer exhibiting the desired pattern of transistor gate width and polysilicon structure.

When phase shift mask 210 is placed over a photoresist coated silicon wafer and light is shined onto the mask, the light is transmitted through the 0 degree phase clear area 215 and the 180 degree phase clear area 213. This results in the underlying photoresist material being exposed and creating the phase shift mask light area 233 displayed as part of phase shift mask image 230. The light does not transmit through the phase shift mask chrome 216 and thus the underlying photoresist is not exposed resulting in the other dark area 236 of the phase shift mask image 230. At the boundary between the 180 degree phase clear area 213 and the 0 degree phase clear area 215, destructive interference occurs and the photoresist underlying this boundary is not exposed resulting in the production of the gate dark area 232. The light does not transmit through the control chrome 217 and thus the underlying photoresist is not exposed. The width of the control chrome 217 is variable and can be varied to change the length of the gate dark area 232. This feature allows for greater control over the width of the gate dark area 232 produced when the design does not require the maximum gate shrinking possible via phase shifting.

When structure mask 220 is placed over a photoresist coated silicon wafer and light is shined onto the mask, the light is transmitted through the clear area 224, and the photoresist material underlying the clear area 224 is exposed. This exposure will erase any unwanted artifacts created by the phase shift mask 210, and produces the structure light area 244 of structure mask image 240. The light does not transmit through the variable gate protect chrome 222 resulting in the gate protect dark area 242. The variable gate protect chrome 222 is sized such that its width is greater than the desired transistor gate length. This ensures that the gate dark area 232 produced by phase shifting will not be destroyed by inadvertent exposure. The light does not transmit through the structure chrome 226 resulting in the production of the structure dark area 246 which correlates to the shape and size of the desired polysilicon structure.

The advantages of this dual mask phase shifting process are significant, and overcome the problems associated with the process disclosed by Spence. These advantages stem from the fact that, the phase shift mask 210 is used solely to produce a desired circuit dimension that requires the use of interference such as a shrunk transistor gate length, while a second separate structure mask 220 is used to produce the remaining polysilicon structure and erase any unwanted artifacts. First, manufacturing of the masks is greatly simplified in that there is no combination of features on one mask to be concerned with. Similarly, since the only critical performance feature of the phase shift mask 210 is the placement of the 180 degree phase clear areas 213, it is much easier to inspect the masks after they have been manufactured.

The decreased complexity of the phase shift mask when compared to the combined mask disclosed in Spence also reduces the problem of design rule conflicts. As stated earlier, the combining of phase shift and structure elements on a single mask greatly increases the. possible number of design rule conflicts that have to be sorted by the computer to come up with a mask design that will implement the desired shrunk circuit. This results in a much more complicated and time consuming process for the computer, and situations where a solution might not exist. The current invention overcomes these problems by separating the elements onto separate masks which greatly reduces the number of possible design conflicts on a single mask.

Lastly, the masks disclosed in Spence differ substantially from the old mask 100. This is a direct result of combining the phase shift and structure functions on one mask. One embodiment of the invention uses a structure mask 220 that appears very similar to the old mask 100. This is an advantage for integrated circuit designers in that they can visually do a double check of the mask design by comparing the structure mask 220 directly to the old mask 100.

In another embodiment of the invention a portion of the polysilicon circuit structure is included on the phase shift mask. Although less desirable than placing all of the structure on the structure mask, this would add flexibility to the process of mask design. For, in a situation where design rules prevent the design of a structure mask which includes all of the structure, it may be possible to include some of the needed structure on the phase shift mask.

c. Design Shrinking

Figure 3:
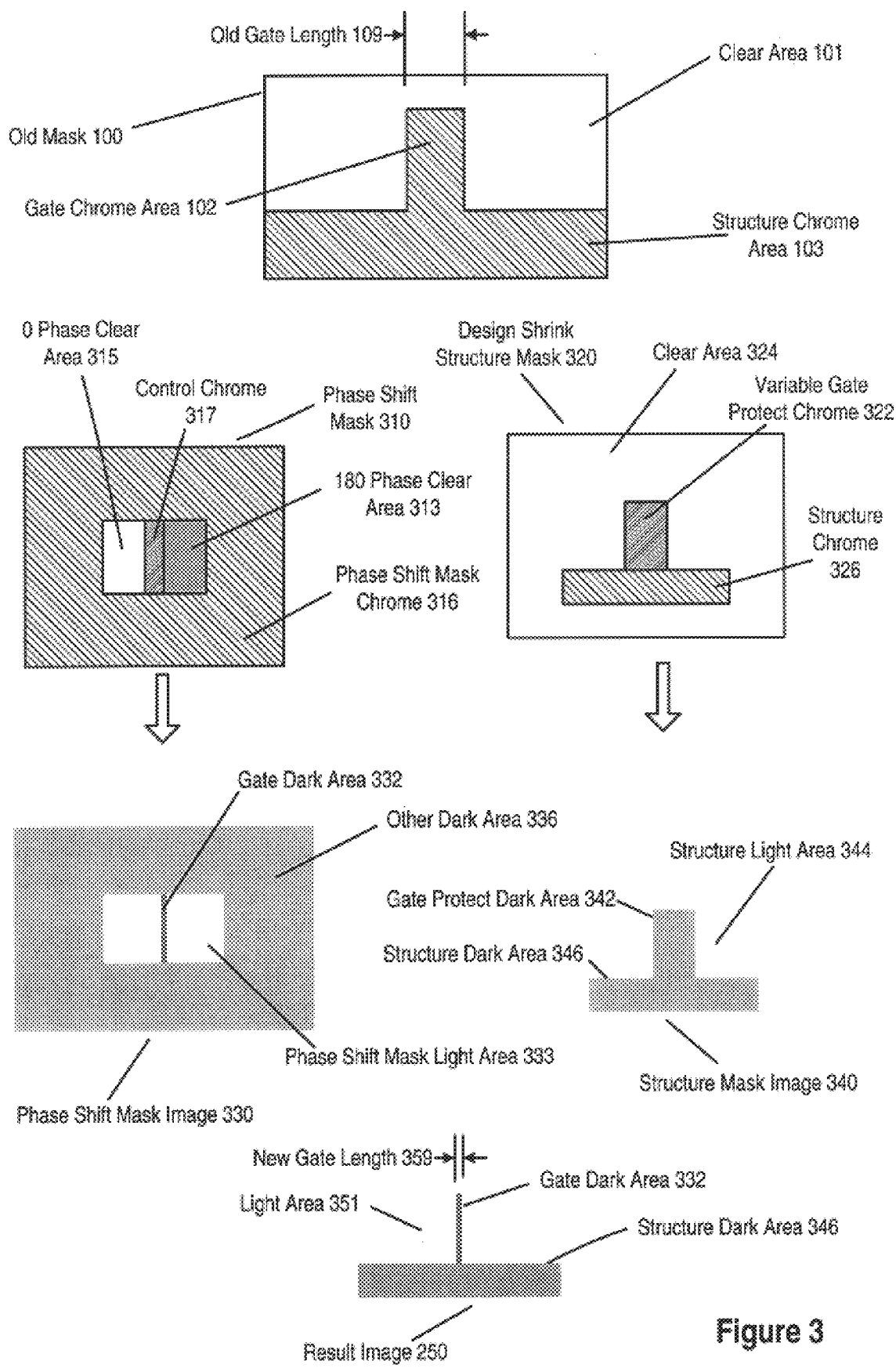
FIG. 3 illustrates one embodiment of a dual mask phase shifting process for shrinking an integrated circuit design.

FIG. 3 illustrates one embodiment of a dual mask phase shifting process for shrinking an integrated circuit design. The concepts applicable to FIG. 2 apply here as well, and as such the following discussion will focus on the differences between FIGS. 2 and 3.

FIG. 2 illustrated an embodiment solely for the shrinking of a circuit dimension that required interference, in the specific case, the gate length of all transistors in a circuit. FIG. 3 on the other hand is an embodiment of a process to shrink an entire integrated circuit design structure including the transistor gate lengths. For purposes of illustration of this embodiment, it is assumed that the chosen shrink factor for the circuit decreased only the transistor gate length to a dimension that required phase shifting. The remainder of the circuit is shrunk using conventional optical lithography methods to implement the design shrink. In another embodiment, the dual mask phase shifting may be used to shrink any area requiring interference.

d. Example Flowchart

Figure 4:
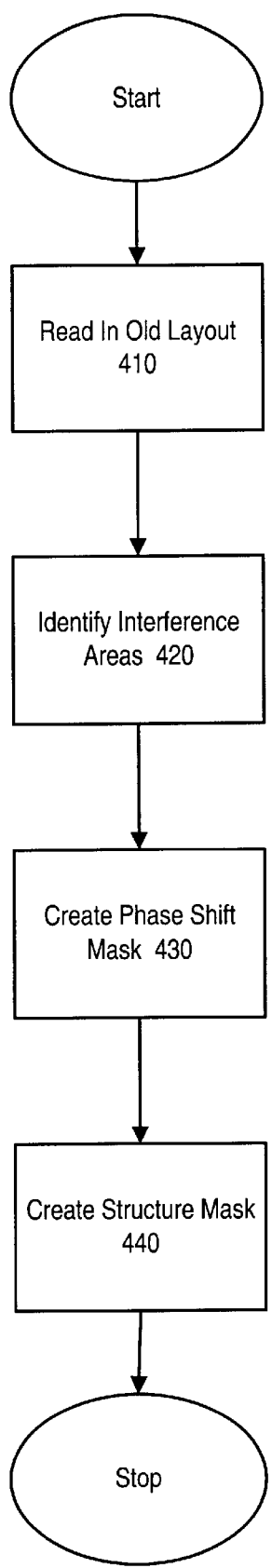
FIG. 4 illustrates one embodiment of a method of creating the masks found in FIGS. 2 and 3.

FIG. 4 illustrates one embodiment of a method of creating the mask found in FIGS. 2 and 3.

This embodiment of the method envisions that each block will be performed by a computer. However, this is not required, and the invention is not limited to a method in which each block is performed by a computer. For instance, a human could perform each of the design steps manually.

At block 410, a computer reads in data including old mask layout data that is supplied either manually or by reading files (e.g. a GDS-II file) preexisting in the computer. In one embodiment, this data will include a previous large dimension integrated circuit design, a new gate length dimension to be applied to all transistors in the integrated circuit design, and various other design rules needed for the design of the masks. In another embodiment, this data will include a previous large dimension integrated circuit design, a shrink factor dimension to be applied to the entire integrated circuit, and various other design rules needed for the design of the masks. In another embodiment, this data will include a previous large dimension integrated circuit design, a new gate length dimension to be applied to all transistors in the integrated circuit design, a shrink factor dimension to be applied to the remainder of the integrated circuit, and various other design factors needed for the design of the masks. In still another embodiment, this data will include a previous integrated circuit design with shrunk transistor gate lengths, a shrink factor to be applied to the remainder of the integrated circuit, and various other design factors needed for the design of the masks.

At block 420, the computer identifies areas on the new circuit design that have dimensions that are too small to be achieved by traditional optical lithography and that can be achieved through the use of destructive interference. As the limits for optical lithography may vary depending upon the application and the physical limits of the particular equipment, the exact quantity of this interference dimension is variable and may be supplied by the user at block 410 in addition to the other manufacturing process data.

At block 430, the computer creates a phase shift mask design by locating a phase shift area in each place in the circuit where the computer has previously identified there to be a need for an interference dimension. Each phase shift area includes adjacent clear areas that transmit light 180 degrees out of phase with each other, with the boundary between the areas falling where the interference dimension needs to be. This computer produced design data can then be input into a mask manufacturing device that will convert the design data into a physical mask.

At block 440, the computer creates a structure mask design. The computer analyzes the required circuit structure and designs the mask such that opaque areas appear everywhere that a polysilicon structure so requires. The computer will also design the structure mask such that opaque areas appear over each area that was previously determined to require a phase shift area. The width of this gate protect area is variable and sensitive to user input. The computer will also analyze the design to ensure that clear areas appear wherever needed to erase unwanted phase shift artifacts. This computer produced design data can then be input into a mask manufacturing device that will convert the design data into a physical mask. In one embodiment, the computer generates GDS-II data describing the phase shifting mask and the structure mask.

e. Design Rules

Figure 5:
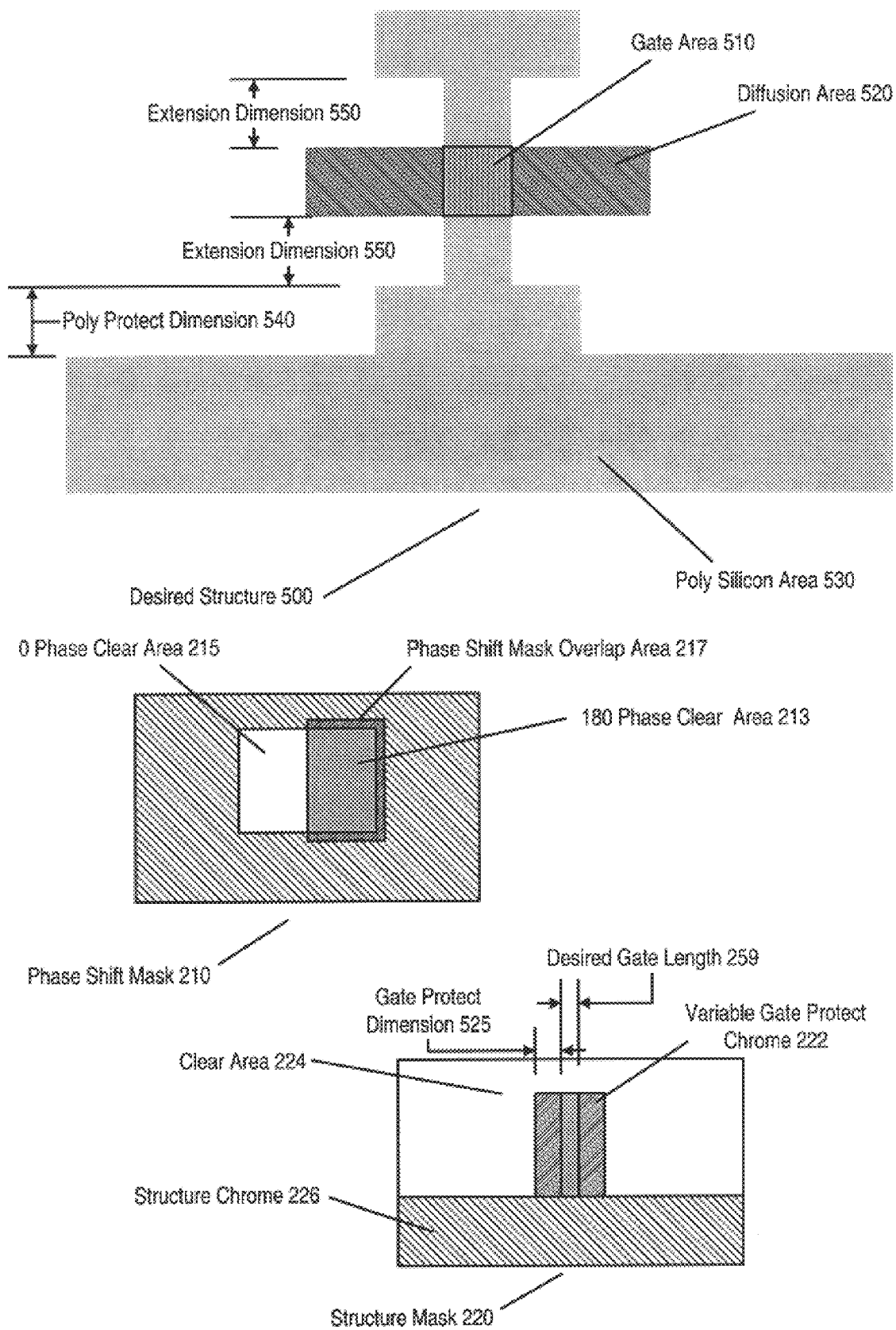
FIG. 5 illustrates one embodiment of a desired integrated circuit structure and effective design rules.

FIG. 5 illustrates one embodiment of a desired integrated circuit structure and effective design rules. FIG. 5 includes the following elements: a desired structure 500, a phase shift mask 210, and a structure mask 220. The desired structure 500 includes a gate area 510, a diffusion area 520, a polysilicon area 530, a poly protect dimension 540, and an extension dimension 550. The phase shift mask 210 includes a 180 degree phase clear area 213, a 0 degree phase clear area 215, and a phase shift mask overlap area 217. The structure mask 220 includes variable gate protect chrome 222, a clear area 224, structure chrome 226, desired gate length 259, and a gate protect dimension 525.

The actual phase shift mask design must take into account possible imperfections in the mask manufacturing process. These imperfections include mask misalignment and double exposure. Desired structure 500 represents the image of a design structure that takes into account the various dimensions that are required to be defined in order to avoid any problems that may be caused by these potential manufacturing imperfections.

One embodiment of the invention is designed to shrink transistor gate length. Thus, the mask must be designed such that the gate area 510 of the transistor is shrunk even if the masks are misaligned. To accomplish this, the phase shift areas on the phase shift mask are designed to be of a width that is equal to the width of the diffusion area 520 plus the two extension dimensions 550 shown in FIG. 5. The extension dimensions are a function of the maximum possible alignment error involved in the physical mask manufacturing process.

It is also required that the polysilicon area 530 be protected from any inadvertent exposure during the process. This is accomplished by providing the poly protect dimension 540 which is a function of the maximum possible alignment error. Thus in the actual mask design, no phase shift mask phase shift area will be of a width that is within the poly protect dimension 540 of any structure on the structure mask.

Phase shift mask 210 is the same as in FIG. 2 except that it shows phase shift mask overlap area 217. Here it is shown that the actual 180 degree phase clear area 213 is larger than the adjacent 0 degree phase clear area 215. This extra material is overlapped by the chrome of the mask, and thus the phase shift mask overlap area 217 does not allow light to transmit through. The size of the phase shift mask overlap area 217 is a function of physical manufacturing needs in putting the mask together.

Lastly, structure mask 220 is the same as in FIG. 2 except that it shows gate protect dimension 525 and desired gate length 259. The variable gate protect chrome 222 is designed to be of a width equal to the desired gate length 259 plus two times the gate protect dimension 525. The gate protect dimension is a function of possible mask misalignment. This dimension serves to ensure that the shrunken gate length produced by the phase shift mask is protected from subsequent inadvertent exposure.

f. Conclusion

What has been described is a method and apparatus for creating a phase shift mask and a structure mask for shrinking integrated circuit designs. In one embodiment, the phase shift mask is designed to create dark areas on a photoresist coated silicon wafer which correspond to a particular dimension requiring interference, specifically a shrunk transistor gate length. In another embodiment, the phase shift mask is designed to create dark areas on a photoresist coated silicon wafer which correspond to any desired dimension requiring interference. In each of these embodiments, the structure mask is designed to erase unwanted artifacts created by the phase shift mask, and to produce the remainder of the original polysilicon structure. In another embodiment, the phase shift mask is designed to create dark areas on a photoresist coated silicon wafer which correspond to any desired dimension requiring interference, while the structure mask is designed to erase unwanted artifacts, and to produce the remainder of the polysilicon structure in a shrunken form. In another embodiment, the structure mask is modified to compensate for additional design rules of the target technology. For example, allocations for mask misalignments may require that the second mask be modified slightly.

What is claimed is:

1. A method for manufacturing a set of masks, comprising:

creating a phase shift layout file having phase shift areas in an opaque field to define a gate length dimension for a transistor having a diffusion region with a first width, the phase shift area having a width equal to the width of the diffusion region plus extension dimensions sufficient to tolerate mask misalignment errors, and creating a structure layout file having opaque areas to define other structures; and manufacturing at least one mask using the phase shift layout file and the structure layout file.

2. The method of claim 1, wherein the extension dimensions are defined according to an alignment error design rule.

3. A method for manufacturing a set of masks, comprising:

creating a phase shift layout file having phase shift areas in an opaque field to define a structure;

creating a structure layout file having opaque areas to define other structures, the opaque areas being spaced away by clear areas from the phase shift areas by protection dimensions sufficient to tolerate mask misalignment errors; and manufacturing at least one mask using the phase shift layout file and the structure layout file.

4. The method of claim 3, wherein the extension dimensions are defined according to an alignment error design rule.

5. A method for manufacturing a set of masks, comprising:

creating a phase shift layout file having phase shift areas in an opaque field to define a structure;

creating a structure layout file having opaque areas to define other structures and protect areas to protect the structure from exposure, the protect area having a width equal to the width of the diffusion region plus protection dimensions sufficient to tolerate mask misalignment errors; and manufacturing at least one mask using the phase shift layout file and the structure layout file.

6. The method of claim 5, wherein the extension dimensions are defined according to an alignment error design rule.

7. A method for manufacturing a set of masks, comprising:

creating a phase shift layout file having phase shift areas in an opaque field to shrink a gate length dimension for a transistor to a smaller dimension, wherein the phase shift areas includes a θ degree phase shift area, and an adjacent (180+θ) phase shift area, and a chrome strip between the θ degree phase shift area, and the adjacent (180+θ) phase shift area, the chrome strip having a width affecting the smaller dimension of the gate length;

creating a structure layout file having opaque areas to define other structures; and manufacturing at least one mask using the phase shift layout file and the structure layout file.

8. A method for manufacturing a set of masks, comprising:

creating a first layout file having first and second clear areas in an opaque field, the first and second clear areas separated by an opaque line to form a gate length dimension for a transistor having a diffusion region with a first width, the first and second clears areas having a width equal to the width of the diffusion region plus extension dimensions sufficient to tolerate mask misalignment errors, and creating a second layout file having opaque areas to define other structures; and manufacturing a first mask using the first layout file layout file and a second mask using the second layout file.

9. The method of claim 8, wherein the extension dimensions are defined according to an alignment error design rule.

10. The method of claim 8, wherein the first and second clear areas are adapted to cause different amounts of phase shifting.

11. The method of claim 8, wherein the opaque line comprises a chrome strip having a width affecting the gate length dimension.

* * * * *